(12) United States Patent
Yen et al.

(10) Patent No.: US 8,624,383 B2
(45) Date of Patent: Jan. 7, 2014

(54) INTEGRATED CIRCUIT PACKAGE AND METHOD FOR FABRICATION THEREOF

(76) Inventors: Yu-Lin Yen, Taoyuan (TW); Chen-Mei Fan, Taoyuan (TW)

( * ) Notice: Subject to any disclaimer, the term of this patent is extended or adjusted under 35 U.S.C. 154(b) by 299 days.

(21) Appl. No.: 12/836,477

(22) Filed: Jul. 14, 2010

(65) Prior Publication Data

US 2010/0276774 A1 Nov. 4, 2010

Related U.S. Application Data

(62) Division of application No. 11/878,568, filed on Jul. 25, 2007, now Pat. No. 8,003,442.

(30) Foreign Application Priority Data

Mar. 19, 2007 (TW) .............................. 96109307 A

(51) Int. Cl.
*H01L 23/12* (2006.01)
(52) U.S. Cl.
USPC ........... 257/704; 257/433; 257/434; 257/680; 257/698; 257/E31.117; 257/E23.181; 257/E23.188; 257/E23.19
(58) Field of Classification Search
USPC .......... 257/433, 434, 680, 698, 704, E31.117, 257/E23.181, E23.188, E23.19; 438/64, 66, 438/116
See application file for complete search history.

(56) References Cited

U.S. PATENT DOCUMENTS

| | | | |
|---|---|---|---|
| 6,777,263 B1 * | 8/2004 | Gan et al. | 438/106 |
| 6,777,767 B2 | 8/2004 | Badehi | |
| 2001/0018236 A1 * | 8/2001 | Badehi | 438/127 |
| 2003/0124762 A1 * | 7/2003 | Hashimoto | 438/67 |
| 2004/0099959 A1 * | 5/2004 | Tang | 257/778 |
| 2004/0159920 A1 * | 8/2004 | Omori | 257/676 |
| 2005/0059188 A1 * | 3/2005 | Bolken et al. | 438/106 |
| 2006/0038250 A1 * | 2/2006 | Omori | 257/434 |
| 2006/0043555 A1 * | 3/2006 | Liu | 257/680 |
| 2006/0079019 A1 | 4/2006 | Kim | |
| 2006/0267189 A1 * | 11/2006 | Usui et al. | 257/723 |
| 2007/0222048 A1 * | 9/2007 | Huang | 257/678 |

FOREIGN PATENT DOCUMENTS

TW 273686 B 2/2007
TW 200709373 3/2009

* cited by examiner

*Primary Examiner* — Kimberly Rizkallah
*Assistant Examiner* — Maria Ligai
(74) *Attorney, Agent, or Firm* — Birch, Stewart, Kolasch & Birch, LLP

(57) ABSTRACT

The invention provides an integrated circuit package and method of fabrication thereof. The integrated circuit package comprises an integrated circuit chip having a photosensitive device thereon; a bonding pad formed on an upper surface of the integrated circuit chip and electrically connected to the photosensitive device; a barrier formed between the bonding pad and the photosensitive device; and a conductive layer formed on a sidewall of the integrated circuit chip and electrically connected to the bonding pad. The barrier layer blocks overflow of the adhesive layer into a region, on which the photosensitive device is formed, to improve yield for fabricating the integrated circuit package.

20 Claims, 10 Drawing Sheets

INTEGRATED CIRCUIT PACKAGE AND METHOD FOR FABRICATION THEREOF

CROSS REFERENCE TO RELATED APPLICATIONS

This application is a Divisional of U.S. application Ser. No. 11/878,568, filed on Jul. 25, 2007 now U.S. Pat. No. 8,003,442 and entitled "Integrated circuit package and method for fabrication thereof". This application claims priority of Taiwan Patent Application No. 96109307, filed on Mar. 19, 2007, the entirety of which is incorporated by reference herein.

BACKGROUND OF THE INVENTION

1. Field of the Invention

The invention relates to integrated circuit packages, and more particularly to an integrated circuit package having high yield and a method for fabricating the same.

2. Description of the Related Art

In integrated circuit device fabrication, an integrated circuit packaging step is performed. The integrated circuit, in which the packaging step is performed, can be used in a wide variety of applications, including computers, mobile phones and digital cameras. Yield of the integrated circuit package can affect performance of an integrated circuit device.

FIGS. 1A-1D are cross-sections of a conventional integrated circuit package. As shown in FIGS. 1A-1B, a protective layer 8 is formed on a covering plate 4 prior to bonding. FIGS. 1C-1D show a protective layer 8 formed on a covering plate 4 prior to bonding. In FIG. 1A, an integrated circuit chip 2, which has photosensitive devices 12 formed thereon and electrically connected to a bonding pad 6, is illustrated. A covering plate 4 is then attached to the integrated circuit chip 2 by an adhesive layer 10 to form a distance 14 between the covering plate 4 and the integrated circuit chip 2. During bonding of the covering plate 4 to the integrated circuit chip 2, the adhesive layer 10 overflows onto the photosensitive devices 12, as shown in FIG. 1A. FIG. 1B is a cross-section of the integrated circuit package, in which the adhesive layer 10 overflows onto the photosensitive devices 12 during bonding, in FIG. 1A. In FIG. 1B, the adhesive layer overflows onto the photosensitive device 12, and covers a portion of the photosensitive devices 12, so that sensitivity of the photosensitive devices 12 to light from covering plate 4 and distance 14 becomes uniform, which results in failure of the integrated circuit package.

In FIG. 1C, an integrated circuit chip 2 having photosensitive device 12 and a bonding pad 6 is provided. A protective layer 8 covers the bonding pad 6, which is electrically connected to the photosensitive devices 12. A covering plate 4 is subsequently attached to the integrated circuit chip 2 by an adhesive layer 10 to form a distance 14 therebetween. As shown in FIG. 1C, during bonding, the adhesive layer 10 overflows onto the photosensitive device 12 along a sidewall of the protective layer 8. FIG. 1D is a cross-section of an integrated circuit package, in which the adhesive layer 10 overflows onto the photosensitive devices 12 during bonding in FIG. 1C. The adhesive layer 10 overflows onto the photosensitive device 12 and covers a portion of photosensitive device 12, so that yield for fabricating the integrated circuit package, as shown in FIG. 1D, is reduced. Accordingly, the problems described occur in conventional bonding.

Thus, an integrated circuit package and fabrication method thereof is needed to eliminate the problems described and increase yield of fabrication.

BRIEF SUMMARY OF INVENTION

Accordingly, the invention provides an integrated circuit package. An exemplary embodiment of the integrated circuit package comprises an integrated circuit chip having a photosensitive device thereon; a bonding pad formed on an upper surface of the integrated circuit chip and electrically connected to the photosensitive device; a first barrier formed between the bonding pad and the photosensitive device; and a conductive layer formed on a sidewall of the integrated circuit chip and electrically connected to the bonding pad. The integrated circuit package further comprises a second barrier layer between the bonding pad and the first barrier layer.

The invention also provides a method for fabricating an integrated circuit package. The method comprises providing an integrated circuit chip having a photosensitive device thereon; forming a bonding pad on the integrated circuit chip, and electrically connected to the photosensitive device; forming a first barrier between the bonding pad and the photosensitive device; and forming a conductive layer on a sidewall of the integrated circuit chip, and electrically connected to the bonding pad.

The integrated circuit package has a barrier layer between the bonding pad and the photosensitive device. Thus, the barrier layer blocks an overflow of an adhesive layer into the photosensitive device during bonding. Furthermore, since the barrier layer is disposed between the bonding pad and photosensitive device, the position and amount of the adhesive layer is thus accurately controlled to reduced fabrication cost.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
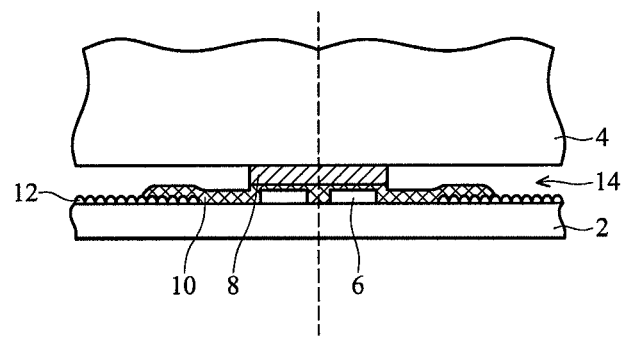
FIGS. 1A-1D are cross-sections of a conventional integrated circuit package.
Figure 1B:
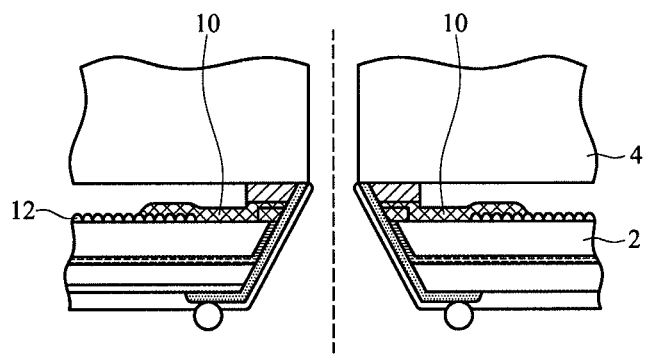
Figure 1C:
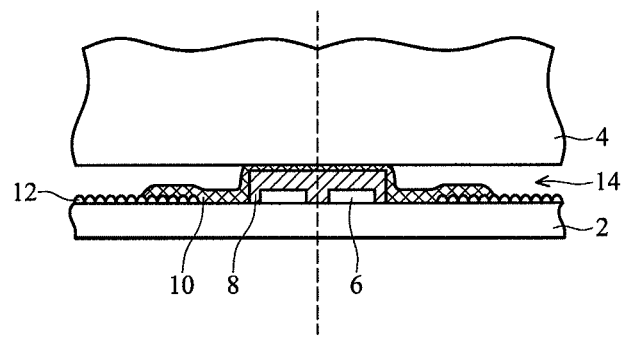
Figure 1D:
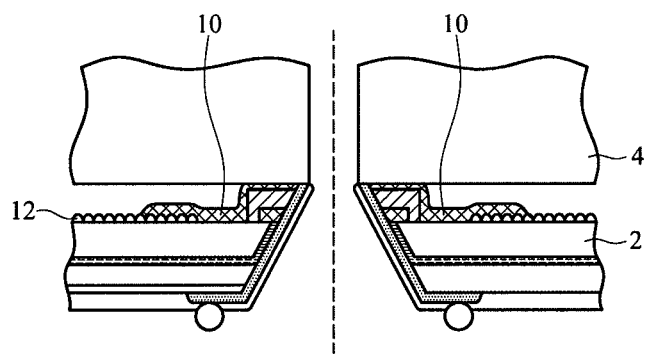
Figure 2A:
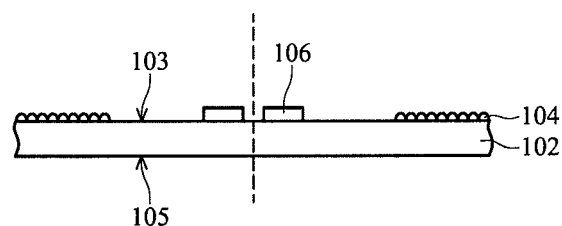
FIGS. 2A-2H are cross-sections of a method for fabricating an integrated circuit package according to first embodiment of the invention.

FIGS. 2A-2H are cross-sections of a method for fabricating an integrated circuit package according to a first embodiment of the invention. In FIG. 2A, an integrated circuit chip 102 having upper and low surfaces 103, 105 is provided. A photosensitive device 104 is then formed on the upper surface 103 of the integrated circuit 102. A bonding pad is subsequently formed on the upper surface 103 and electrically connected to the photosensitive device 104, as shown in FIG. 2A.

In an embodiment, the integrated circuit chip 102 may be a photosensitive integrated circuit chip. Preferably, the bonding pad 106 is a material such as copper, aluminum or any suitable conductive material. In some embodiments, a conductive layer is formed on the integrated circuit chip 102 by, for example, sputtering or evaporating followed by photolithography and etching to form the bonding pad 106. It is appreciated that while divided bonding pads are shown in FIG. 2A, the bonding pad may also be a continuous layer.

Figure 2B:
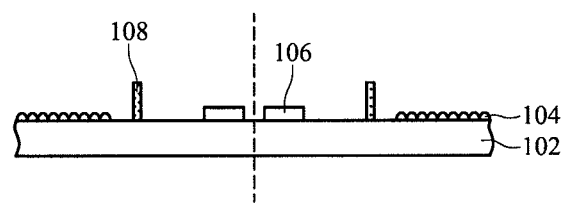

In FIG. 2B, a barrier layer 108, also referred to as gate pattern, is then formed on the upper surface 103 of the integrated circuit chip 102, and the barrier layer 108 is between the bonding pad 106 and the photosensitive device 104. In an embodiment, an insulating layer (not shown) is formed on the integrated circuit chip 102 by coating followed by patterning the insulating layer by photolithography and etching to form the barrier layer 108. Preferably, the barrier layer 108 is a material such as polyimide, epoxy, polyester or any suitable insulating material.

Figure 2C:
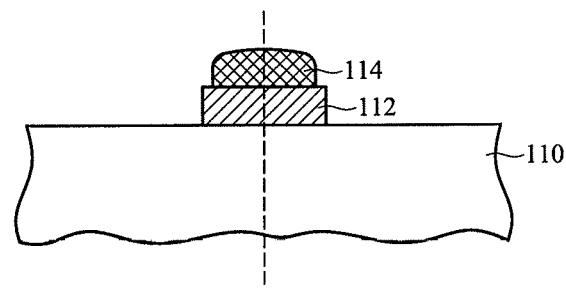

In FIG. 2C, a first substrate 110, also referred to as a covering plate, is provided. A protective layer 112, referred to as a dam, is subsequently formed on the first substrate 110 to prevent oxidation. In an embodiment, the first substrate 110 may be glass, quartz, opal, plastic or any suitable transparent material. Preferably, the protective layer 112 is polyimide, epoxy or suitable insulating material. As shown in FIG. 2C, an adhesive layer 114 is formed on the protective layer 112. Preferably, the adhesive layer 114 is an adhesive material containing epoxy.

Figure 2D:
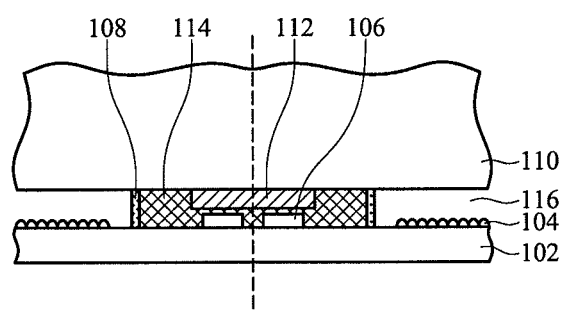

In FIG. 2D, the first substrate 110 is attached to the upper surface of the integrated circuit chip 102 by the adhesive layer 114 to form a distance between the first substrate 110 and integrated circuit chip 102. After bonding the first substrate 110 to the integrated circuit chip 102, the protective layer 112 covers the bonding pad 106 to prevent oxidation. The barrier layer 108 is between the protective layer 112 and the photosensitive device 104. Preferably, a distance between the barrier layer 108 and the protective layer 112 is more than or equal to 0.5 µm.

Note that because the barrier layer is disposed between the bonding pad 106 and the photosensitive layer 104, the adhesive layer 114 is formed between the barrier layer 108 and the bonding pad 106, as shown in FIG. 2D. Accordingly, when processing bonding, the barrier layer blocks adhesive layer overflow into a region on which the photosensitive device is formed, preventing failure of the integrated circuit package. For example, adhesive layer overflow into a portion of the photosensitive device can cause light sensitized by the photosensitive device to be uniform or the portion of the photosensitive device covered by the adhesive layer unable to sensitize light. Furthermore, since the barrier layer is disposed between the bonding pad and photosensitive device, the position and amount of the adhesive layer is thus accurately controlled to reduce fabrication cost.

After bonding, a polishing step may optionally be performed to thin the integrated circuit chip 102, facilitating cutting of individual die. In an embodiment, the integrated circuit chip has a thickness of between about 10 µm and 250 µm after the polishing step, facilitating cutting of individual die.

Figure 2E:
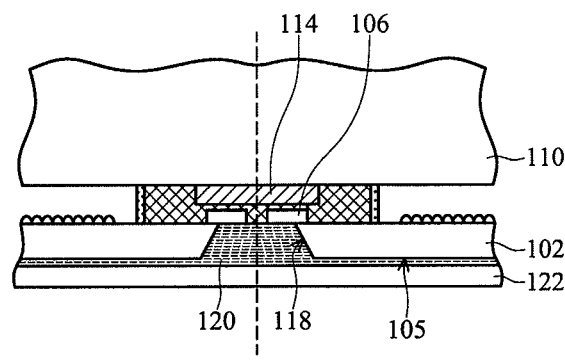

In FIG. 2E, a portion of the integrated circuit chip 102 is removed along a predetermined cutting line of the die by photolithography and etching to form an opening 118 for cutting individual die. The opening 118 may expose the protective layer 114 and a lower surface of the bonding pad 106.

In one embodiment, the etching process may be dry etching using a gas comprising sulfur hexafluoride ($SF_6$), octafluorocyclobutane ($C_4F_8$) or any suitable gas. In some embodiments, the etching process may be wet etching comprising silicon etchant, for example a solution mixing 2.5% of hydrogen fluoride acid (HF), 50% of hydrogen nitrate acid (HNO3), 10% of acetic acid (CH3COOH) and 37.5% of water, for removing a portion of the integrated circuit chip 102 and exposing the bonding pad 106. The silicon etchant may also comprise potassium hydroxide (KOH).

As shown in FIG. 2E, a second substrate 122 is subsequently attached to the lower surface 105 of the integrated circuit chip 102 by a sealant 120. The sealant 120 is formed on the lower surface 105 of the integrated circuit 102 and filled in the opening 118. In one embodiment, the sealant 120 such as epoxy, polyimide (PI) or suitable material is formed on the lower surface 105 of the integrated circuit 102 by coating. The second substrate 122 may be a material similar to the first substrate or a suitable opaque substrate. Furthermore, the second substrate 122 may carry the integrated circuit chip 102, thus, the second substrate 122 may also be referred to as a carry plate.

Figure 2F:
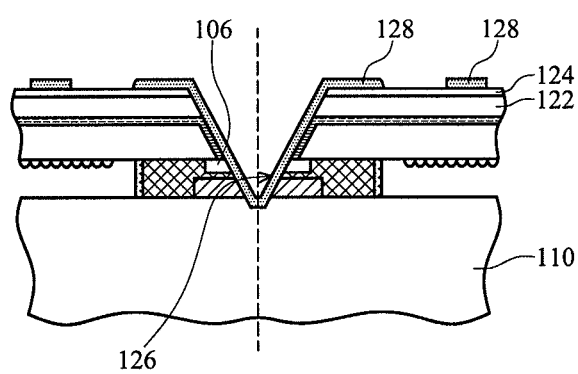

FIG. 2F is a cross-section of the integrated circuit package in FIG. 2E rotated through 180°. In FIG. 2F, an insulating layer 124 is formed on the second substrate 122. Thereafter, a notching step, also referred to as cutting step, is performed along the predetermined cutting line of the individual die by notching equipment to form a trench 126 and expose a sidewall of the bonding pad 106 and a surface of the first substrate 110.

In some embodiments, the insulating layer 124 such as silicon oxide, silicon dioxide, silicon nitride, photoresist material or any suitable dielectric material, may be formed by, for example spin coating, spray coating, or low pressure chemical vapor deposition (LPCVD), plasma enhanced chemical vapor deposition (PECVD).

In FIG. 2F, a conductive layer 128 is formed on the insulating layer 124 and extending to the trench 126 to electrically connect to the bonding pad 106. Preferably, the conductive layer 128 may be aluminum, copper, nickel or any suitable conductive material. In an embodiment, a metal layer is conformally formed on the insulting layer 124, in which the metal layer extends from the surface of the insulating layer 124 and the sidewall of the bonding pad 106 to the surface of the first substrate 110, by sputtering, evaporating, electroplating or plasma enhanced chemical vapor deposition (PECVD). The metal layer is patterned by lithography and etching to form the conductive layer 128 and expose a portion of the insulating layer 124.

Note that the metal layer may be difficultly formed on the bottom of the trench 126 since the bottom of the trench 126 is narrow. Thus, electroless-plating is optionally performed to form the conductive layer 128 on the bottom of the trench 126 after forming the metal layer. It is appreciated that the conductive layer 128 is formed only by electroless-plating without patterning the metal layer.

Figure 2G:
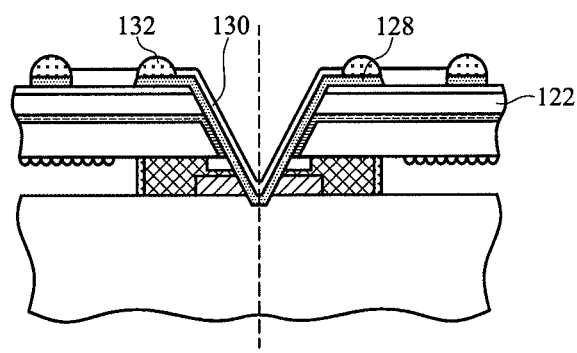

In FIG. 2G, a solder mask 130 is formed on the conductive layer 128 to expose a portion of the conductive layer 128 which defines a position of a solder ball 132 subsequently formed. The solder ball 132 is then formed on the exposed conductive layer 128 to electrically connect the conductive layer 128. The solder mask 130 serves as a protective layer.

Figure 2H:
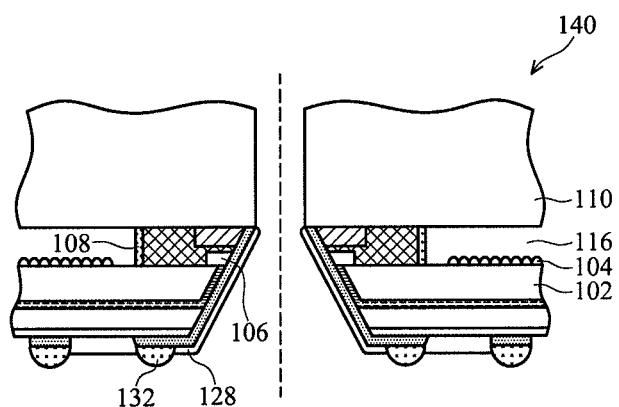

An individual die is then cut along the predetermined cutting line thereof by a cutter, after the described steps. Thus, fabrication of an integrated circuit package 140, as shown in FIG. 2H, is complete. FIG. 2H is a cross-section of the integrated circuit package in FIG. 2G cut and rotated through 180°. As the integrated circuit package 140 shown in FIG. 2H, a photosensitive device 104 and bonding pad 106 are formed on an integrated circuit chip 102, on which the bonding pad 106 is electrically connected to the photosensitive device 104. A conductive layer 128 is formed on a sidewall of the integrated circuit chip 102 and electrically connected to bonding pad 106 and solder ball 132.

In FIG. 2H, a first substrate 110 is correspondingly disposed over the integrated circuit chip 102 and a distance 116 is formed therebetween. Note that the integrated circuit package 140 according to first embodiment of the invention has a barrier layer 108 between the bonding pad 106 and the photosensitive device 106 to prevent adhesive layer overflow into the photosensitive device 104 avoiding faults in package fabrication.

Figure 3A:
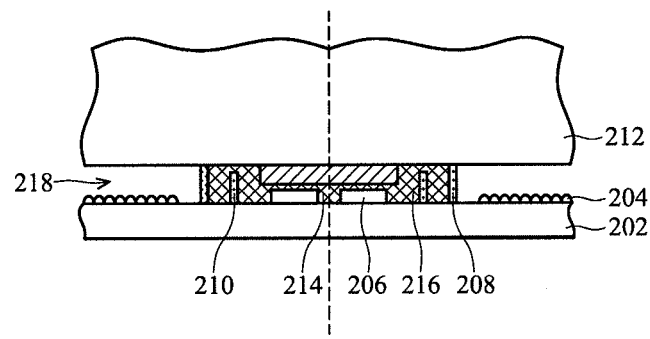
FIGS. 3A-3B are cross-sections of a method for fabricating an integrated circuit package according to second embodiment of the invention.
Figure 3B:
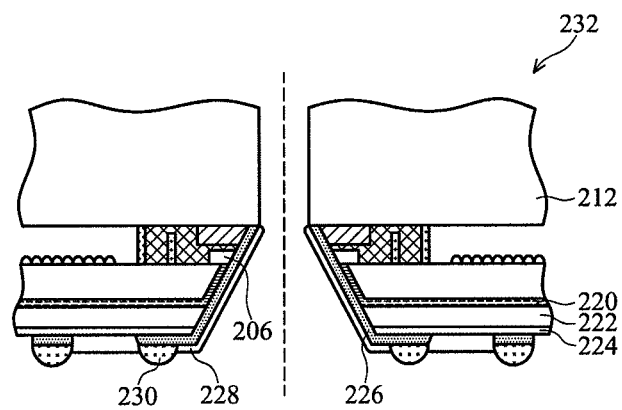

FIGS. 3A-3B are cross-sections of a method for fabricating an integrated circuit package according to second embodiment of the invention. In FIG. 3A, an integrated circuit chip 202, on which a photosensitive device 204 formed, is provided. A bonding pad 206 is then formed on the integrated circuit chip 202 and electrically connected to the photosensitive device 204. Thereafter, a first barrier layer 208 and a second barrier layer 210, also referred to as gate pattern, are formed on the integrated circuit chip 202, and between the bonding pad 206 and the photosensitive device 204. In an embodiment, a height of the second barrier layer 210 is less than or equal to one of the first barrier layer 208. The second barrier layer 208 is between the first barrier layer 208 and the bonding pad 206. Preferably, a distance between the second barrier layer 210 and a protective layer 214 subsequently formed is more than or equal to about 0.5 μm.

As shown in FIG. 3A, a first substrate 212, which has a protective layer 214 and an adhesive layer 216 formed thereon, is provided. The first substrate 212 is then attached to the integrated circuit chip 202 by the adhesive layer 216 to form a distance therebetween. After bonding, the protective layer 214 covers the bonding pad 206 and the adhesive layer 216 covers the second barrier layer 210.

After bonding is complete, a portion of the integrated circuit chip 202 is removed to form an individual die. Thereafter, a second substrate 222 is attached to a lower surface of the integrated circuit chip 202 by a sealant 220. An insulating layer 224 is formed on a lower surface of the second substrate 212 followed by a notching step to expose the bonding pad 206. A conductive layer 226 is formed on a sidewall of the second substrate 222 and extending to the bonding pad 206 to electrically connect to the bonding pad 206. A solder mask 228 is then formed on the conductive layer 226. A solder ball 230 is then formed on the conductive layer 226. Finally, an individual die is cut along the predetermined cutting line thereof by cutter to complete a fabrication of integrated circuit package 232, as shown in FIG. 3B. Formation and material of the described elements may be similar to first embodiment, thus, further description is not provided.

Note that the integrated circuit package according to the second embodiment of the invention has first and second barrier layers between the bonding pad and the photosensitive device. Thus, during bonding, the adhesive layer does not overflow onto a region, on which the photosensitive device is formed, avoiding failure of the integrated circuit package caused by the adhesive layer. Furthermore, overflow of the adhesive layer is effectively blocked by the first and second barrier layers. It is appreciated that protective layer in the first and second embodiments may also be formed on the integrated circuit chip and the protective layer may be formed with the barrier layer in situ to reduce processes.

Figure 4A:
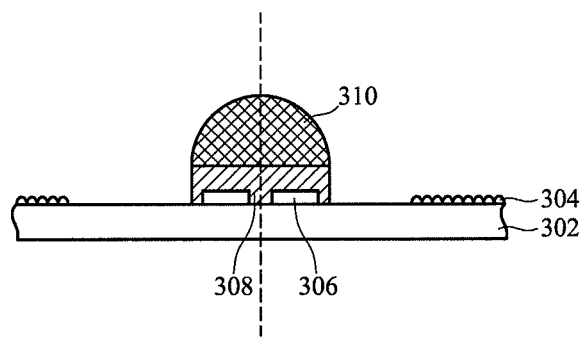
FIGS. 4A-4D are cross-sections of a method for fabricating an integrated circuit package according to third embodiment of the invention.

FIGS. 4A-4D, are cross-sections of a method for fabricating an integrated circuit package according to a third embodiment of the invention. In FIG. 4A, an integrated circuit chip 302 having a photosensitive device 304 is provided. A bonding pad 306 is then formed on the integrated circuit chip 302 and electrically connected to photosensitive device 304. As shown in FIG. 4A, a protective layer 308, also referred to as dam, covers the bonding pad 306 for protection. An adhesive layer 310 is subsequently formed on the protective layer 308. Formation and material of the elements may be the same as first embodiment, thus, further description is not provided.

Figure 4B:
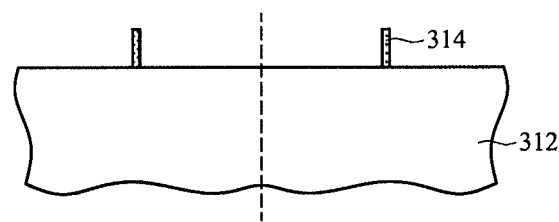

FIG. 4B shows a first substrate 314, on which a barrier layer 314 is formed. Formation and material of the first substrate 312 and barrier layer 314 are preferably similar to the first embodiment. The first substrate 312 is bonded to the integrated circuit chip 302 by the adhesive layer 310 to form a distance 316 between the first substrate 312 and integrated circuit chip 302, as shown in FIG. 4C.

Figure 4C:
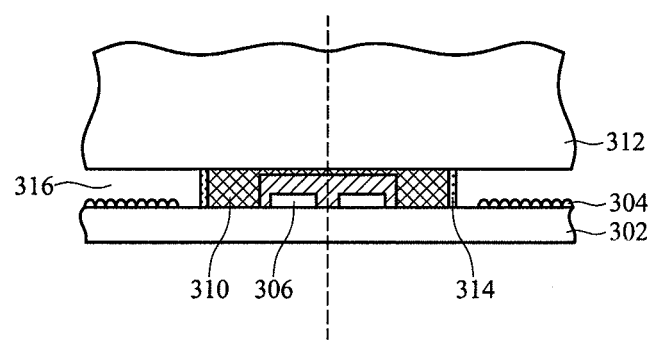

In FIG. 4C, after bonding, the barrier layer 314 disposed on the first substrate 302, is formed between the bonding pad 306 and photosensitive 304 to block overflow of the adhesive layer 310 into the photosensitive device 304. In one embodiment, when bonding is performed, a distance between the barrier layer 314 and protective layer 308 is more than or equal to about 0.5 mm.

Figure 4D:
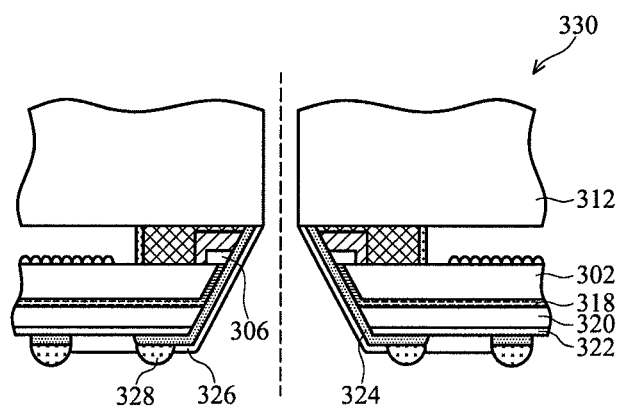

After bonding, the integrated circuit chip 302 is cut by photolithography and etching to form an individual die. Thereafter, a second substrate 320 is attached to a lower surface of the integrated circuit chip 302 by a sealant 318. An insulating layer 322 is formed on a lower surface of the second substrate 320 followed by a notching step, also referred to as cutting step, to expose a sidewall of the bonding pad 306 and a surface of the first substrate 312. A conductive layer 324 is subsequently formed on a sidewall of the integrated circuit chip 302 and electrically connected to bonding pad 306. A solder mask 326 covers a portion of the conductive layer 324. Thereafter, a solder ball 328 is formed on the conductive layer 324. Finally, an individual die is cut along the predetermined cutting line thereof by cutter to complete a fabrication of integrated circuit package 330, as shown in FIG. 4D. Formation and material of the described elements may be the same as first embodiment, thus, further description is not provided.

Note that the integrated circuit package according to the third embodiment of the invention has the barrier layer disposed thereon. During bonding, the barrier layer is formed between the bonding pad and the photosensitive device. Thus, overflow of the adhesive layer is blocked into the photosensitive device to avoid failure of the integrated circuit package.

Figure 5A:
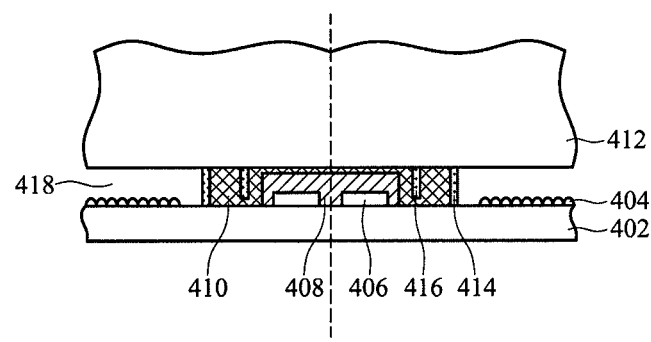
FIGS. 5A-5B are cross-sections of a method for fabricating an integrated circuit package according to fourth embodiment of the invention.
Figure 5B:
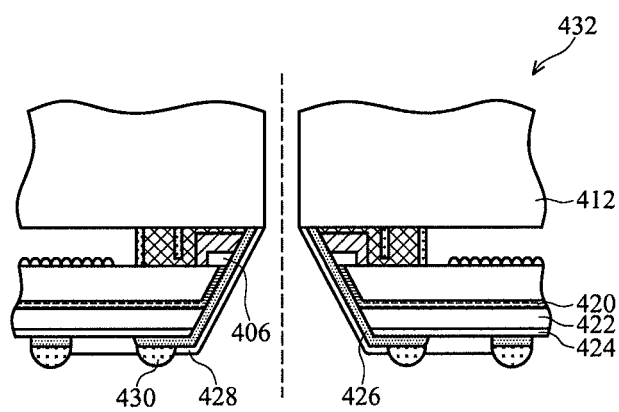

FIGS. 5A-5B are cross-sections of a method for fabricating an integrated circuit package according to fourth embodiment of the invention. In FIG. 5A, an integrated circuit chip 402 having a photosensitive device 404 thereon is provided. A bonding pad 406, which is electrically connected to the photosensitive device 404, is subsequently formed on the integrated circuit chip 402. Thereafter, a protective layer 408 covers the bonding pad 406 for protection and an adhesive layer 401 is formed thereon.

As shown in FIG. 5A, a first substrate 412 having a first barrier layer 414 and a second barrier layer 416 thereon is bonded to the integrated circuit chip 402 by the adhesive layer 410 to form a distance 418. In one embodiment, the second barrier layer 416 has a height less than or equal to the first barrier layer 414. After bonding, the first and second barrier layers 414, 416 are between the bonding pad 406 and the photosensitive device 418. Preferably, a distance between the second barrier layer 416 and the protective layer 408 is more than or equal to 0.5 μm. Note that an adequate distance may be between the first and second barrier layers to hold the adhesive layer 410 therebetween.

After bonding, the integrated circuit chip 402 is cut by photolithography and etching to form an individual die. Thereafter, a second substrate 422 is attached to a lower surface of the integrated circuit chip 402 by a sealant 420. An insulating layer 424 is then formed on a lower surface of the second substrate 422 followed by a notching step, also referred to as cutting step, to expose a sidewall of the bonding pad 406 and a surface of the first substrate 412. A conductive layer 426 is subsequently formed on a sidewall of the second substrate 422 and extending to the surface of the first substrate 412 to electrically connect to bonding pad 406. A solder mask 428 covers a portion of the conductive layer 426. Thereafter, a solder ball 430 is formed on the conductive layer 426. Finally, an individual die is cut along the predetermined cutting line thereof by cutter to complete a fabrication of integrated circuit package 432, as shown in FIG. 5B. Formation and material of the described elements may be the same as first embodiment, thus, further description is not provided.

Note that the integrated circuit package according to the fourth embodiment of the invention has the first and second barrier layers formed on the first substrate. After bonding, the first and second barrier layers are between the bonding pad and the photosensitive device. Thus, the adhesive layer does not overflow onto a region, on which the photosensitive device is formed, to avoid failure of the integrated circuit package caused by the adhesive layer for increasing yield thereof. Furthermore, overflow of the adhesive layer is effectively blocked by the first and second barrier layers in this embodiment.

Note that the protective layer in third and fourth embodiments may also be formed on the first substrate and the protective layer may be formed with the barrier layers in situ to reduce processes. The first and second barrier layers may also be formed on the first substrate and integrated circuit chip, respectively to block overflow of the adhesive layer. Although drawings of the described embodiments are illustrated in cross-section, barrier layers may be a ring surrounding the photosensitive device on the integrated circuit chip to limit the adhesive layer from spreading.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit package, comprising:
   an integrated circuit chip having a photosensitive device thereon;
   a substrate disposed overlying the integrated circuit chip;
   a protective layer disposed between the integrated circuit chip and the substrate, wherein the protective layer and the substrate surround a space overlying the photosensitive device, there is no bonding wire structure in the protective layer, and the protective layer is made of an insulating material;
   a first barrier formed between the photosensitive device and the protective layer, wherein the first barrier is a patterned insulating layer;
   an adhesive layer located between the first barrier layer and the protective layer, wherein the adhesive layer is directly connected to the protective layer; and
   a bonding pad electrically connected to the photosensitive device, wherein the protective layer covers the bonding pad.

2. The package as claimed in claim 1, further comprising a second barrier between the protective layer and the first barrier.

3. The package as claimed in claim 2, wherein the first barrier has a height more than or equal to a height of the second barrier.

4. The package as claimed in claim 2, wherein the second barrier is separated from the protective layer by a distance.

5. The package as claimed in claim 1, wherein the first barrier is separated from the protective layer by a distance.

6. The package as claimed in claim 1, wherein a height of the first barrier is equal to a height of the space.

7. The package as claimed in claim 1, wherein the adhesive layer filled in the space for bonding the substrate to the integrated circuit chip, wherein the first barrier separates the adhesive layer from the photosensitive device.

8. The package as claimed in claim 7, wherein the adhesive layer is an insulating material.

9. The package as claimed in claim 1, wherein the protective layer is disposed directly on the integrated circuit chip.

10. The package as claimed in claim 1, wherein the protective layer is disposed directly on the substrate.

11. The package as claimed in claim 1, wherein the protective layer completely covers the bonding pad.

12. The package as claimed in claim 11, wherein the protective layer directly contacts the bonding pad.

13. An integrated circuit package, comprising:
   an integrated circuit chip having a photosensitive device thereon;
   a substrate disposed overlying the integrated circuit chip;
   a protective layer disposed between the integrated circuit chip and the substrate, wherein the protective layer and the substrate surround a space overlying the photosensitive device, there is no bonding wire structure in the protective layer, and the protective layer is made of an insulating material;
   a first barrier formed between the photosensitive device and the protective layer, wherein the first barrier is a patterned insulating layer;
   an adhesive layer located between the first barrier and the protective layer, wherein the adhesive layer is directly connected to the protective layer;
   a second barrier formed between the protective layer and the first barrier, wherein a material of the substrate is different from a material of the first barrier or a material of the second barrier; and
   a bonding pad electrically connected to the photosensitive device, wherein the protective layer covers the bonding pad.

14. The package as claimed in claim 13, wherein the first barrier has a height more than or equal to a height of the second barrier.

15. The package as claimed in claim 13, wherein a height of the first barrier is equal to a height of the space.

16. The package as claimed in claim 13, wherein the protective layer completely covers the bonding pad.

17. An integrated circuit package, comprising:
   an integrated circuit chip having a photosensitive device thereon;
   a substrate disposed overlying the integrated circuit chip;

a protective layer disposed between the integrated circuit chip and the substrate, wherein the protective layer and the substrate surround a space overlying the photosensitive device, there is no bonding wire structure in the protective layer, and the protective layer is made of an insulating material;

a first barrier formed between the photosensitive device and the protective layer, wherein the first barrier is a patterned insulating layer;

an adhesive layer located between the first barrier and the protective layer, wherein the adhesive layer is directly connected to the protective layer;

a second barrier formed between the protective layer and the first barrier, wherein a material of the protective layer, a material of the first barrier, and a material of the second barrier are the same; and a bonding pad electrically connected to the photosensitive device, wherein the protective layer covers the bonding pad.

18. The package as claimed in claim 17, wherein the first barrier has a height more than or equal to a height of the second barrier.

19. The package as claimed in claim 17, wherein a height of the first barrier is equal to a height of the space.

20. The package as claimed in claim 17, wherein the protective layer completely covers the bonding pad.

* * * * *